United States Patent [19]

Tomofuji et al.

[11] Patent Number: 4,842,373
[45] Date of Patent: Jun. 27, 1989

[54] CONNECTING STRUCTURE FOR CONNECTING A LIQUID CRYSTAL DISPLAY AND A FLEXIBLE FLAT CABLE

[75] Inventors: Makoto Tomofuji; Fumiaki Yamanashi, both of Iwaki, Japan

[73] Assignee: Alps Electric Co., Ltd., Japan

[21] Appl. No.: 170,917

[22] Filed: Mar. 17, 1988

[30] Foreign Application Priority Data

Jun. 15, 1987 [JP] Japan .............................. 62-90709[U]

[51] Int. Cl.$^4$ ............................................. G02F 1/13
[52] U.S. Cl. .................................... 350/336; 350/333; 350/334; 350/343
[58] Field of Search ............... 350/336, 343, 334, 333, 350/342; 340/765

[56] References Cited

U.S. PATENT DOCUMENTS

| | | | |
|---|---|---|---|
| 4,295,711 | 10/1981 | Tanaka et al. | 350/334 |
| 4,500,171 | 2/1985 | Renz et al. | 350/343 |
| 4,640,581 | 2/1987 | Nakamowatari et al. | 350/336 |
| 4,787,712 | 11/1988 | Ukai et al. | 350/333 |

FOREIGN PATENT DOCUMENTS

| | | | |
|---|---|---|---|
| 0036828 | 3/1980 | Japan | 350/343 |
| 0070529 | 6/1981 | Japan | 350/336 |
| 0166929 | 8/1985 | Japan | 350/343 |

OTHER PUBLICATIONS

D. H. Kirkman, "Hermetic Display Cell" IBM vol. 19, No. 6, Nov. 1976.

Primary Examiner—Stanley D. Miller
Assistant Examiner—Huy Kim Mai
Attorney, Agent, or Firm—Guy W. Shoup; Paul J. Winters; Stephen L. Malaska

[57] ABSTRACT

A connecting structure for connecting a liquid crystal display and a flexible flat cable by soldering electrode terminals formed over the lower glass substrate of the liquid crystal display and connecting electrodes formed over the surface of the free end of the flexible flat cable, and by solidifying the junction of the liquid crystal display and the flexible flat cable with a resin. Through holes are formed in the free end of the flexible flat cable between the connecting electrodes at an appropriate pitch so that the through holes extend lengthwise across the end of the lower glass substrate when the flexible flat cable is put in place on the lower glass substrate. A resin applied to the upper surface of the flexible flat cable spreads over the upper surface of the flexible flat cable near the upper glass substrate of the liquid crystal display and the end surface of the upper glass substrate, flows through the through holes to the backside of the flexible flat cable, and spreads over part of the lower surface of the flexible flat cable near the end of the lower glass substrate and over the end surface of the lower glass substrate. Thus, the resin can be spread over the upper and lower surfaces of the flexible flat cable and over the respective end surfaces of the upper and lower glass substrates through a single resin applying process.

1 Claim, 3 Drawing Sheets

CONNECTING STRUCTURE FOR CONNECTING A LIQUID CRYSTAL DISPLAY AND A FLEXIBLE FLAT CABLE

BACKGROUND OF THE INVENTION

1. Field of the Invention

The present invention relates to a connecting structure for fixedly connecting a liquid crystal display and a flexible flat cable with a resin.

2. Description of the Prior Art

FIGS. 4, 5 and 6 are drawings of assistance in explaining a conventional connecting structure for connecting a liquid crystal display and a flexible flat cable, in which FIG. 4 is a plan view of a flat flexible cable and a liquid crystal display before connection, FIG. 5 is an illustration of assistance in explaining the steps of a connecting process for connecting a liquid crystal display and a flexible flat cable, and FIG. 6 is an illustration showing a liquid crystal display and a flexible flat cable fixedly connected together.

Referring to FIGS. 4, 5 and 6, a liquid crystal display 1 comprises an upper glass substrate 2, a lower glass substrate 3, a liquid crystal, not shown, between the glass substrates 2 and 3, and a polarizing plate 4. Transparent electrodes formed of ITO films or the like are formed over the respective inside surfaces of the glass substrates 2 and 3 in patterns corresponding to display patterns 5. Electrode terminals 6 for electrically connecting the liquid crystal display 1 to an external device extend over the surface of one end of the lower glass substrate 3. The electrode terminals 6 are formed of the same material as that forming the transparent electrodes formed on the glass substrates 2 and 3, and are connected to the transparent electrodes, respectively. Silver layers 7 are formed respectively over the electrode terminals 6 by applying a silver paste to the electrode terminals 6 through a printing process. The silver layers 7 are coated respectively with solder layers 8. A flexible flat cable 9 (hereinafter referred to simply as "cable") comprises a base film 10 such as a polyimide film, connecting electrodes 11 formed over the base film 10 by etching a thin copper film, and an insulating protective layer 12. Portions of the connecting electrodes 11 extending in the free end of the base film 10 are exposed and are coated respectively with solder layers 8.

In connecting the liquid crystal display 1 and the cable 9, the free end of the cable 9 is placed on the lower glass substrate 3 with the connecting electrodes 11 positioned respectively on the corresponding electrode terminals 6 of the liquid crystal display 1, heat, for example, heat of 25° C., and pressure is applied to the solder layers 8 for a predetermined time, for example, three seconds, by a heating member 17 to cause the corresponding solder layers 8 to fuse together so that the electrode terminals 6 and the corresponding connecting electrodes 11 are soldered, and then, an UV (ultraviolet) setting resin 13 is applied to the upper surface of the cable 9, the end surface of the upper glass substrate 2, the lower surface of the cable 9 and the end surface of the lower glass substrate 3 as shown in FIG. 6 to bond firmly together the liquid crystal display 1 and the cable 9.

In securing the upper and lower surfaces of the cable 9 respectively to the end surfaces of the upper glass substrate 2 and the lower glass substrate 3 with the resin 13, the resin 13 is applied to one surface of the cable 9, the resin 13 applied to one surface of the cable is hardened in a furnace, the resin 13 is applied to the other surface of the cable 9 after the resin 13 applied to the former surface of the cable 9 has been hardened, and then the resin 13 applied to the latter surface of the cable 9 is hardened in the furnace, which requires much time and is not satisfactory in respect of efficiency of production.

SUMMARY OF THE INVENTION

The present invention has been made to eliminate the foregoing drawbacks of the conventional connecting structure.

Accordingly, it is an object of the present invention to provide a connecting structure for connecting a liquid crystal display and a flexible flat cable, capable of improving the efficiency of a production line for connecting liquid crystal displays and flexible flat cables.

To achieve the object of the invention, the present invention provides a connecting structure for connecting a liquid crystal display and a flexible flat cable by soldering electrode terminals formed over the lower glass substrate of the liquid crystal display to connect the liquid crystal display electrically to an external device, and connecting electrodes formed on the flexible flat cable, respectively, and by solidifying the junction of the liquid crystal display and the flexible flat cable with a resin, characterized in that through holes are formed in the flexible flat cable between the connecting electrodes so as to extend across the free end of the lower glass substrate to allow a resin applied to the upper surface of the flexible flat cable to flow therethrough to the lower surface of the same, the electrode terminals of the liquid crystal display and the corresponding connecting electrodes of the flexible flat cable are soldered, respectively, and the resin applied to the upper surface of the flexible flat cable flows through the through holes of the flexible flat cable and spreads over the lower surface of the flexible flat cable and the end surface of the lower glass substrate.

Since the through holes for letting a resin flow therethrough are formed in the flexible flat cable between the connecting electrodes so as to extend across the end of the lower substrate of the liquid crystal display, a resin applied to the upper surface of the cable spreads over the end surface of the upper glass substrate, part of the upper surface of the lower glass substrate and the upper surface of the cable, flows through the through holes to the backside of the cable, and spreads over the end surface of the lower glass plate and the lower surface of the cable. The resin spreading over those surfaces is solidified in a furnace to connect the liquid crystal display and the cable firmly.

Thus, the resin needs to be applied only once only to the upper surface of the cable in connecting the upper and lower surfaces of the cable firmly to the upper and lower glass substrates of the liquid crystal display with the resin, so that the efficiency of a production line for connecting liquid crystal displays and cables is improved.

BRIEF DESCRIPTION OF THE DRAWINGS

The above and other objects, features and advantages of the present invention will become fully apparent from the following description taken in conjunction with the accompanying drawings, in which:

FIGS. 1, 2 and 3 are illustrations of assistance in explaining a connecting structure for connecting a liquid crystal display and a flexible flat cable, in a preferred embodiment, according to the present invention, in which:

FIG. 1 is a fragmentary plan view of a flexible flat cable,

FIG. 2 is a fragmentary plan view of a liquid crystal display and the flexible flat cable of FIG. 1 as placed on the exposed end of the lower glass substrate of a liquid crystal display, and FIG. 3 is a fragmentary side elevation of the liquid crystal display and the flexible flat cable of FIG. 1 which are bonded together with a resin; and FIGS. 4, 5 and 6 are illustrations of assistance in explaining a conventional connecting structure for connecting a liquid crystal display and a flexible flat cable, in which:

FIG. 4 is a fragmentary plan view of a liquid crystal display and a flexible flat cable before being connected to the liquid crystal display, FIG. 5 is a side elevation of assistance in explaining a process for connecting the liquid crystal display and flexible flat cable of FIG. 4, and FIG. 6 is a fragmentary side elevation of the liquid crystal display and the flexible flat cable of FIG. 4, which are connected firmly with a resin.

DESCRIPTION OF THE PREFERRED EMBODIMENT

Figure 1:
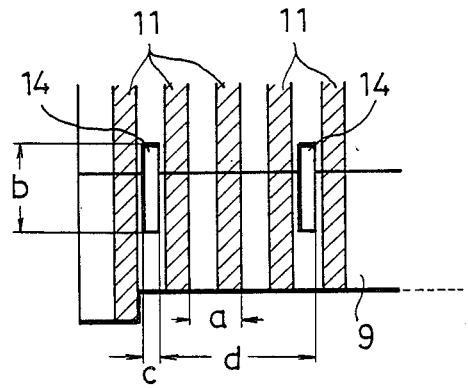
Figure 3:
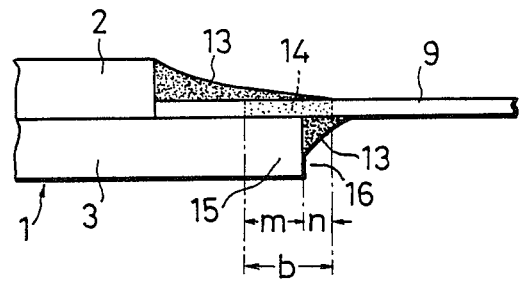
Figure 4:
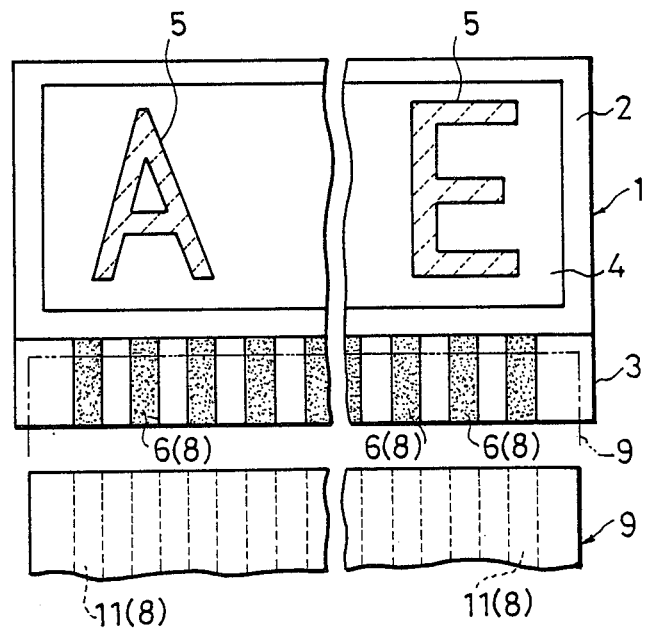
Figure 5:
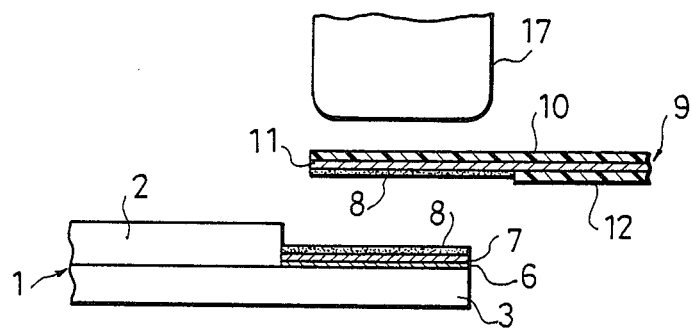
Figure 6:
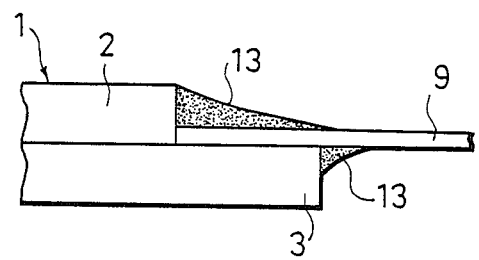

A connecting structure for connecting a liquid crystal display and a flexible flat cable, in a preferred embodiment, according to the present invention will be described hereinafter with reference to FIGS. 1 through 3, in which parts corresponding to those previously described with reference to FIGS. 4 through 6 showing a conventional connecting structure are denoted by the same reference numerals and the description thereof will be omitted.

In this embodiment, means for soldering connecting electrodes 11 formed in a flexible flat cable (hereinafter referred to simply as "cable") 9 and electrode terminals 6 formed in the lower glass substrate 3 of a liquid crystal display 1 is the same as that shown in FIG. 5, and hence the description thereof will be omitted.

Figure 2:
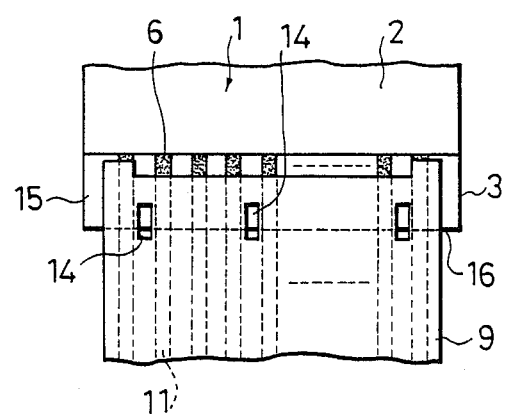

Through holes 14 are formed in the cable 9 between the electrode terminals 11 so as to extend across the end 15 of the lower glass substrate 3 when the cable 9 is put in place on the lower glass substrate 3 as shown in FIG. 2, which is a particular feature of the present invention. For example, when the pitch a of the connecting electrodes 11 of the cable 9 is 1.0 mm, through holes 14 of 1.5 mm in length c and 0.3 mm in width are formed at a pitch d of 3.0 mm in the cable 9. Preferably, the ratio m/n, where m is the length of a portion of each through hole 14 extending over the end portion of the lower glass substrate 3 from the end 15 of the same, and n is the length of each through hole 14 extending outside the lower glass substrate 3 from the end 15 of the same, is on the order of 2/1.

If the pitch d of the through holes 14 is excessively small, the strength of the cable 9 will be reduced accordingly to an unallowable extent, and hence the pitch d of 3 mm is preferable. The ratio 2/1 in m/n insures that disposition of the through holes 14 across the end 15 of the lower glass substrate 3 even if the cable 9 is dislocated from the correct position in soldering the connecting electrodes 11 of the cable and the corresponding electrode terminals 6 of the liquid crystal display 1.

In assembling the liquid crystal display 1 and the cable 9, the connecting electrodes 11 of the cable 9, and the electrode terminals 6 formed over the upper surface of the lower glass substrate 3 of the liquid crystal display 1 are soldered, and then an UV setting resin 13 is applied to the upper surface of the cable 9. Then, the UV setting resin 13 spreads over the upper surface of the cable 9, the end surface of the upper glass substrate 2, and part of the upper surface of the lower glass substrate 3, flows through the through holes 14 to the backside of the cable 9, and spreads over a portion 16 of the lower surface of the cable 9 and the end surface of the lower glass plate 3. Then, the UV setting resin 13 is subjected to a setting process to connect the cable 9 and the liquid crystal display 1 firmly together with the UV setting resin 13.

Thus, the connecting structure of the present invention requires only one resin applying process and the application of the resin only to the upper surface of the cable, which improves the efficiency of a production line for assembling liquid crystal displays and cables.

The resin for firmly connecting the liquid crystal display 1 and the cable 9 need not necessarily be the UV setting resin, but any suitable resin may be used for firmly connecting the liquid crystal display 1 and the cable 9.

Although the invention has been described with a certain degree of particularity, obviously, many changes and variations are possible in the invention. It is therefore to be understood that the present invention may be practiced otherwise than specifically described herein without departing from the scope and spirit thereof.

What is claimed is:

1. A connecting structure for connecting a liquid crystal display having a lower glass substrate with a free end with electrode terminals formed thereon, to a flexible flat cable having connecting electrodes formed thereon, said electrode terminals and said connecting terminals being joined together by a solder layer and forming a junction, said junction being covered by a resin;

wherein the improvement comprises through holes formed in said flexible flat cable between said connecting electrodes such that said through holes extend from the surface of said lower glass substrate to an area beyond said free end of said lower glass substrate when said flexible flat cable is put in place on said lower glass substrate, and said through holes allow a resin applied to an upper surface of said flexible flat cable to flow therethrough to a lower surface thereof wherein said resin spreads over said lower surface of said flexible flat cable and further spreads over said free end of said lower glass substrate.

* * * * *